United States Patent
Huang et al.

(10) Patent No.: US 9,698,249 B2
(45) Date of Patent: Jul. 4, 2017

(54) EPITAXY IN SEMICONDUCTOR STRUCTURE AND MANUFACTURING METHOD OF THE SAME

(71) Applicant: TAIWAN SEMICONDUCTOR MANUFACTURING COMPANY LTD., Hsinchu (TW)

(72) Inventors: Yi-Ming Huang, Tainan (TW); Hsiu-Ting Chen, Tainan (TW); Shih-Chieh Chang, Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/158,673

(22) Filed: Jan. 17, 2014

(65) Prior Publication Data
US 2015/0206939 A1    Jul. 23, 2015

(51) Int. Cl.
*H01L 29/66* (2006.01)
*H01L 29/78* (2006.01)

(52) U.S. Cl.
CPC .. *H01L 29/66795* (2013.01); *H01L 29/66628* (2013.01); *H01L 29/785* (2013.01); *H01L 29/7848* (2013.01); *H01L 29/66636* (2013.01)

(58) Field of Classification Search
None
See application file for complete search history.

(56) References Cited

U.S. PATENT DOCUMENTS

| | | | | |
|---|---|---|---|---|
| 2004/0063301 A1* | 4/2004 | Fu | ............................ | C23C 16/24 438/478 |
| 2008/0048217 A1* | 2/2008 | Kim | ..................... | H01L 29/1045 257/288 |
| 2008/0296614 A1* | 12/2008 | Uejima | ........... | H01L 21/823412 257/190 |
| 2011/0027956 A1* | 2/2011 | Domenicucci | ........ | H01L 21/324 438/301 |
| 2011/0147828 A1* | 6/2011 | Murthy | ............. | H01L 21/02057 257/327 |
| 2012/0202338 A1* | 8/2012 | Ye | ...................... | H01L 21/02532 438/478 |
| 2012/0261726 A1* | 10/2012 | Yang | ................. | H01L 21/28123 257/288 |

(Continued)

*Primary Examiner* — Andres Munoz
(74) *Attorney, Agent, or Firm* — WPAT, P.C., Intellectual Property Attorneys; Anthony King (57) ABSTRACT

The present disclosure provides a semiconductor structure having an insulating layer positioning on a substrate; a semiconductor fin partially located in the insulating layer; and a metal gate over the semiconductor fin and the insulating layer. The semiconductor fin includes a first region including a first lattice constant and a second region in proximity to the metal gate, including a second lattice constant. At least one dislocation is located only in the second region of the semiconductor fin. The present disclosure provides a method for manufacturing a semiconductor structure, including forming a gate over a first semiconductor layer, removing a portion of the first semiconductor layer in proximity to a sidewall of the gate and obtaining a recess, and forming a second semiconductor layer in the recess. At least one dislocation is in-situ formed in the second semiconductor layer without extending to the first semiconductor layer.

18 Claims, 11 Drawing Sheets

(56) References Cited

U.S. PATENT DOCUMENTS

| | | | |
|---|---|---|---|
| 2013/0009216 A1* | 1/2013 | Tsai | H01L 21/823807 257/288 |
| 2013/0193492 A1* | 8/2013 | Adam | H01L 21/823807 257/288 |
| 2015/0221509 A1* | 8/2015 | Chen | H01L 21/02587 257/77 |

* cited by examiner

EPITAXY IN SEMICONDUCTOR STRUCTURE AND MANUFACTURING METHOD OF THE SAME

BACKGROUND

Semiconductor processing is typically used in the fabrication of integrated circuits, which entails particularly stringent quality demands. A variety of methods are used in the semiconductor manufacturing industry to deposit material onto surfaces. One of the most widely used methods is chemical vapor deposition ("CVD"), in which atoms or molecules contained in a vapor deposit on a surface to form a film. CVD allows for the growth of films on device surface areas, including "epitaxial" films comprised of a crystalline silicon-containing material It is often desirable to have epitaxial material that is strained. "Strain" may influence the electrical properties of semiconductors materials, such as silicon, carbon-doped silicon, germanium and silicon germanium alloys. Tensile strain helps to enhance electron mobility, which is particularly desirable for nMOS devices, while compressive strain helps to enhance hole mobility, which is particularly desirable for pMOS devices. Methods of providing strained material are thus of considerable interest and have potential applications in a variety of semiconductor processing applications Stress-memorization techniques (SMTs) are applied in high-performance environments to improve nMOS devices. By carefully controlling the amorphization and re-crystallization of a planar device channel, the effects of a stress force applied to the device will remain even after the stressor is removed. The stress effects improve charge mobility through the channel, thereby improving device performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In order to exert a tensile or a compressive stress in the channel region of the semiconductor structure, a stress-memorization technique (SMT) operation can be used to regrow a lattice-mismatched source or drain region with respect to the channel region or the substrate. Usually various dislocation will form inside the strained source and drain regions prepared by SMT operation. The SMT operation increases charge mobility through the channel. This leads to dramatic improvements in device performance. Transistors having undergone SMT operation demonstrate higher drive strength for a given channel size and supply voltage.

A general SMT operation includes at least (a) forming a capping layer on a transistor, (b) performing a pre-amorphization implantation on the transistor, (c) performing a thermal anneal on the transistor, (d) removing the capping layer, (e) removing a portion of the source and/or drain (S/D) region and forming a recess, and (f) forming secondary S/D regions in the recess. The above operations (a) to (d) require multiple photolithography operations and hence generate manufacturing cost. Dislocations usually appear after the operation (c) performing a thermal anneal on the transistor and before the operation (e) removing a portion of the S/D region and forming a recess, as a way to release lattice strain. The partial removal of the S/D region retains at least a portion of the dislocation in the original substrate, and after the operation (f) forming secondary S/D regions in the recess, the remained dislocation in the original substrate serves as a source from which new dislocation propagates into the newly formed secondary S/D regions. In the SMT operation, a portion of the line dislocation generated in the transistor resides in the original substrate, whereas another portion of the line dislocation generated in the transistor resides in the secondary S/D regions.

The present disclosure provides a semiconductor structure including dislocations resides only in the S/D regions and a manufacturing method thereof. The manufacturing method disclosed in the present disclosure does not require operations (a) to (d) in the SMT operation. Instead, the present disclosure provides that a recess at the S/D region is directly formed and subsequently a secondary (regrowth) S/D region is epitaxially grown in the recess. Dislocations are in situ formed in during the growth of the secondary (regrowth) S/D region and are not extending to the original substrate.

Figure 1:
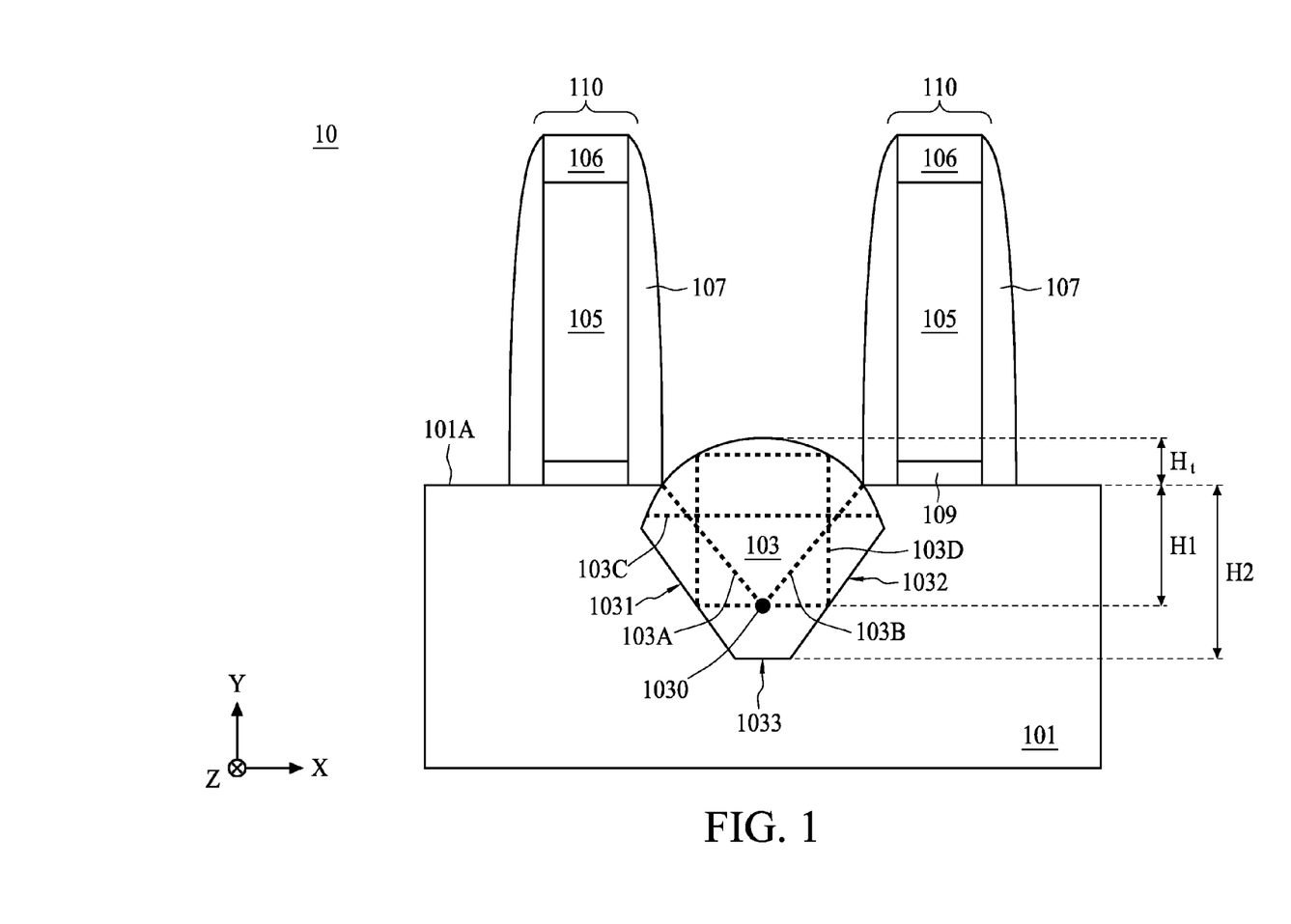
FIG. 1 is a cross sectional view of a regrowth source/drain region between two gates of a planar transistor, in accordance with some embodiments of the present disclosure.

FIG. 1 shows a cross sectional view of a planar transistor 10, for example, a MOSFET. A lower portion of a regrowth region 103 is positioned in a substrate 101, while an upper portion of the regrowth region 103 is protruding from a surface 101A of the substrate 101. Two gates 110 are disposed at two transverse ends (along X direction) of the regrowth region 103.

The substrate 101 shown in FIG. 1 may be a bulk silicon substrate. Alternatively, the substrate 101 may comprise an elementary semiconductor, such as silicon or germanium in a crystalline structure; a compound semiconductor, such as silicon germanium, silicon carbide, gallium arsenide, gallium phosphide, indium phosphide, indium arsenide, and/or indium antimonide; or combinations thereof. Possible substrates 101 also include a silicon-on-insulator (SOI) substrate. SOI substrates are fabricated using separation by implantation of oxygen (SIMOX), wafer bonding, and/or other suitable methods.

Some exemplary substrates 101 include an insulator layer. The insulator layer comprises any suitable material, including silicon oxide, sapphire, other suitable insulating materials, and/or combinations thereof. An exemplary insulator layer may be a buried oxide layer (BOX). The insulator is formed by any suitable process, such as implantation (e.g., SIMOX), oxidation, deposition, and/or other suitable process.

The substrate 101 may include various doped regions depending on design requirements as known in the art (e.g., p-type wells or n-type wells). The doped regions are doped with p-type dopants, such as boron or $BF_2$; n-type dopants, such as phosphorus or arsenic; or combinations thereof. The doped regions may be formed directly on the substrate 101, in a P-well structure, in an N-well structure, in a dual-well structure, or using a raised structure. The semiconductor substrate 101 may further include various active regions, such as regions configured for an N-type metal-oxide-semiconductor transistor device and regions configured for a P-type metal-oxide-semiconductor transistor device In some embodiments, the substrate 101 is made of semiconductor materials having a first lattice constant. For example, 5.4 Å for a silicon substrate, 5.65 Å for a germanium substrate, and a lattice constant in between 5.4 Å and 5.65 Å for a silicon germanium substrate. In some embodiments, a first lattice constant is greater than a second lattice constant in an nMOS transistor, where the materials having a second lattice constant constitute the regrowth region 103. With different regions of the substrate having different lattice constant as described above, a tensile strain is generated in a channel region underneath the gate 110 and hence enhancing the electron mobility that leads to a better performance of the nMOS transistor.

In some embodiments, the gate 110 shown in FIG. 1 has a gate dielectric layer 109, a gate electrode layer 105, and a hard mask layer 106. It is understood that the gate 110 may comprise additional layers such as interfacial layers, capping layers, diffusion/barrier layers, dielectric layers, conductive layers, other suitable layers, and/or combinations thereof. The gate 110 may further include a gate spacer 107. The gate spacers 107, which are positioned on each side of the gate 110 (i.e. on the sidewalls of the gate 110), may comprise a dielectric material, such as silicon nitride, silicon carbide, silicon oxynitride, other suitable materials, and/or combinations thereof. In some embodiments, the gate spacers 107 are used to offset subsequently formed doped regions, such as source/drain regions. The gate spacers 107 may further be used for designing or modifying the source/drain region (junction) profile.

The regrowth region 103 shown in FIG. 1 has a second lattice constant which is different from the first lattice constant constituting other portions of the substrate 101. In some embodiments, the regrowth region 103 has a bottom surface 1033 and slanted surfaces 1031, 1032. In some embodiments, the bottom surface 1033 corresponds to a {001} plane, and the slanted surfaces 1031, 1032 correspond to {111} plane. In some embodiments, the upper portion of the regrowth region 103 may show any suitable lattice planes. A height $H_t$ elevated from the surface 101A of the substrate 101 varies depending on different growth conditions.

In some embodiments, at least one dislocation is present in the regrowth region 103. Dislocations begin at a pinchoff point 1030. From the pinchoff point, the dislocation propagates along one or more planes. The planes are described with reference to the longitudinal axis (Z direction) and transverse axis (X direction) of the transistor 10. One exemplary dislocation is denoted 103A. Dislocation 103A represents an additional plane of atoms runs parallel to the inclined surface 1031. In some embodiments, dislocation 103A corresponds to a 111 Miller index. Such dislocation 103A intersects the surface 101A of the substrate 101 at about a 55-degree angle. Another exemplary dislocation is denoted 103B. Dislocation 103B represents an additional plane of atoms runs parallel to the inclined surface 1032, and also corresponds to a 111 Miller index. In some embodiments, the joint of dislocations 103A and 103B is the pinch off point, and the arrangement of dislocations 103A and 103B resemble a V-shape.

In some embodiments, a height H1 of the V-shaped dislocation measured from the surface 101A of the substrate 101 to the pinch off point 1030 is less than a depth H2 of the regrowth region 103 defined as from the surface 101A to the bottom surface 1033 of the regrowth region 103. In some embodiments, the height H1 may be equal to the depth H2, but the height H1 shall not be greater than the depth H2, that is, neither the pinch off point 1030 nor the V-shaped dislocations 103A, 103B is extending to the substrate 101 portion other than the regrowth region 103.

In some embodiments, dislocations 103A, 103B are parallel to the Z direction and directed towards the surface 101A. For example, dislocations 103A, 103B intersects the surface 101A of the substrate 101 at about a 55-degree angle. In some embodiments, dislocation 103C is parallel to the surface 101A of the substrate 101 and parallel to both the X direction and the Z direction. Dislocation 103D lies parallel to the X direction but angles towards the surface 101A of the substrate 101. These exemplary dislocations are not intended to be limiting, and regrowth region 103 may possess dislocations along any one or more of these planes.

Referring to FIG. 1, the regrowth region 103 is situated between two gates 110 and can be a source region or a drain region of the planar transistor 10. In some embodiments, the widest portion of the regrowth region 103 is greater than a separation between adjacent gates 110. In other words, the portion of the regrowth region 103 buried under the surface 101A of the substrate 101 has a width extending under the gate 110, for example, under the spacer 107 of the gate 110. In some embodiments, the regrowth region 103 includes materials having a second lattice constant that is smaller than the first lattice constant possessed by the original substrate 101. For example, the first lattice constant is greater than the second lattice constant by at least 2%. In some embodiments, the regrowth region 103 includes silicon germanium, phosphor-doped silicon, boron-doped silicon, phosphor-doped silicon carbide, boron-doped silicon carbide, or the combination thereof. In some embodiments, the phosphor-doped silicon forms a special pseudocubic phase $Si_3P_4$ which possesses a smaller lattice constant (about 5.0 Å) than that of the silicon, and thus exerting a tensile stress to the channel region of the planar transistor 10.

Figure 2:
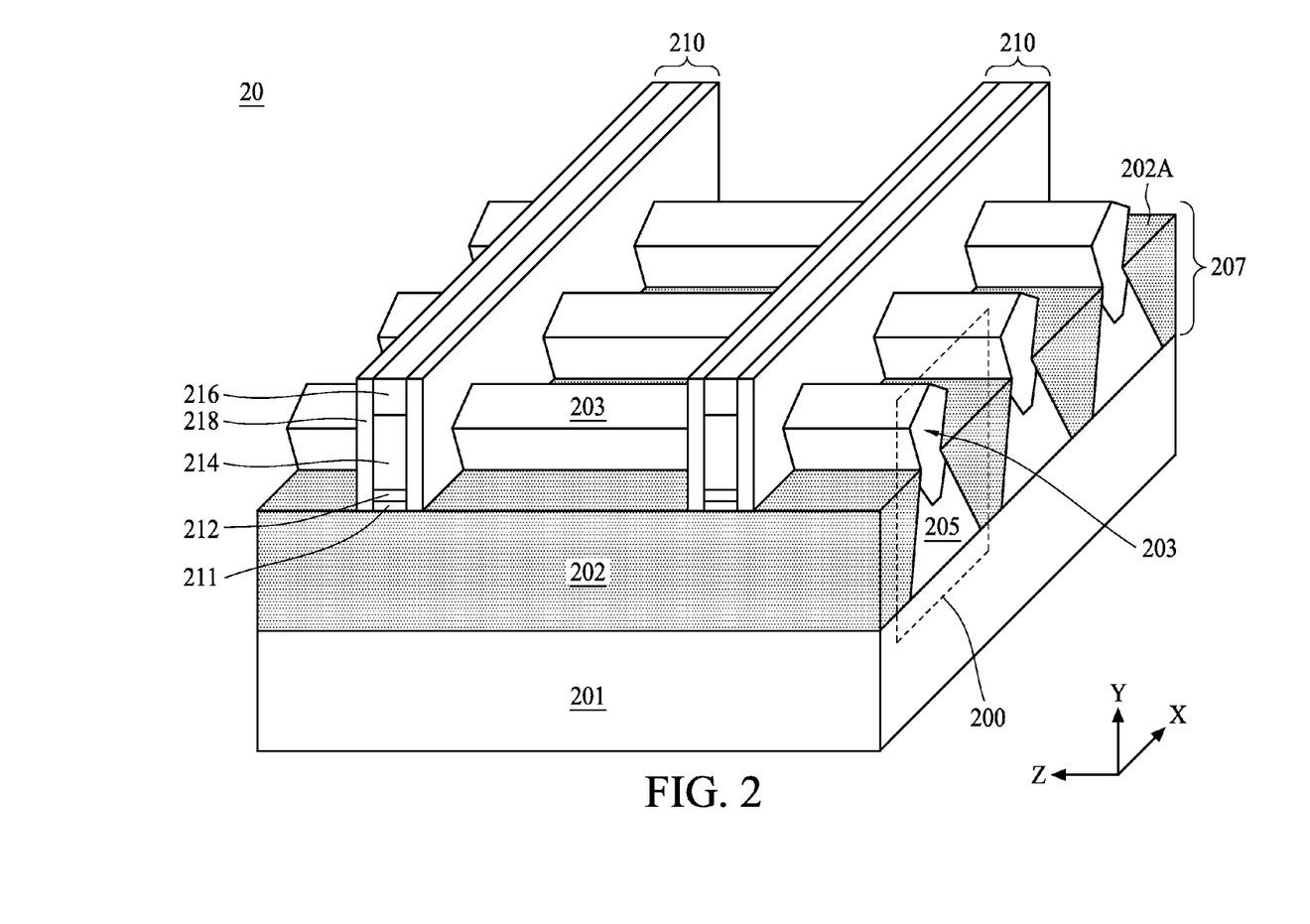
FIG. 2 is a perspective view of regrowth source/drain regions between two metal gates of a FinFET, in accordance with some embodiments of the present disclosure.

FIG. 2 is a perspective view of regrowth source/drain regions 203 and their relative positions to two metal gates 210 of a FinFET 20. The FinFET 20 includes an insulating layer 202 having a top surface 202A and positioning on a substrate 201. A semiconductor fin 207 is partially located in the insulating layer 202 and partially elevated from the top surface 202A of the insulating layer 202. The semiconductor fins 203, 205 are arranged along the Z direction. Two metal gates 210 are positioned in an orthogonal fashion (i.e along the X direction) over the semiconductor fin 203, 205 and the insulating layer 202. The semiconductor fin 207 further includes a first region 205 possessing a first lattice constant and a second region 203 possessing a second lattice constant. Compared to the first region 205, the second region 203 is in proximity or even in contact with the metal gates 210, and at least one dislocation is located only in the second region 203 rather than extending or is present in the first region 205.

Still referring to FIG. 2, the metal gates 201 includes an interfacial layer 211, a gate dielectric layer 212, a gate electrode layer 214, and a hard mask layer 216. It is understood that the metal gates 201 may comprise additional layers such as interfacial layers, capping layers, diffusion/barrier layers, dielectric layers, conductive layers, other suitable layers, and/or combinations thereof. The interfacial layer 211 is formed over the insulating layer 202 and the first region 205 of the semiconductor fin 207. That is, the metal gate 210 is formed after the formation of the first region 205 of the semiconductor fin 207 but prior to an etch back and a regrowth of the second region 203 of the semiconductor fin 207. In some embodiments, the first region 205 wrapped by the metal gate 210 (not shown in FIG. 2) may not possess a same surface contour as that of the second region 203.

As shown in FIG. 2, the metal gate 210 further includes a gate spacer 218. The gate spacers 218, which are positioned on each side of the gate stack (on the sidewalls of the metal gate 210), may comprise a dielectric material, such as silicon nitride, silicon carbide, silicon oxynitride, other suitable materials, and/or combinations thereof. In some embodiments, the gate spacers 218 are used to offset subsequently formed doped regions, such as source/drain regions. The gate spacers 218 may further be used for designing or modifying the source/drain region (junction) profile. In FIG. 2, the boundary between the first region 205 and the second region 203 of the semiconductor fin 207 can be of any shape, for example, a linear boundary, a curved boundary, an irregular boundary, or a combination of several segments representing different pinned surfaces as later described in FIG. 3.

Figure 3:
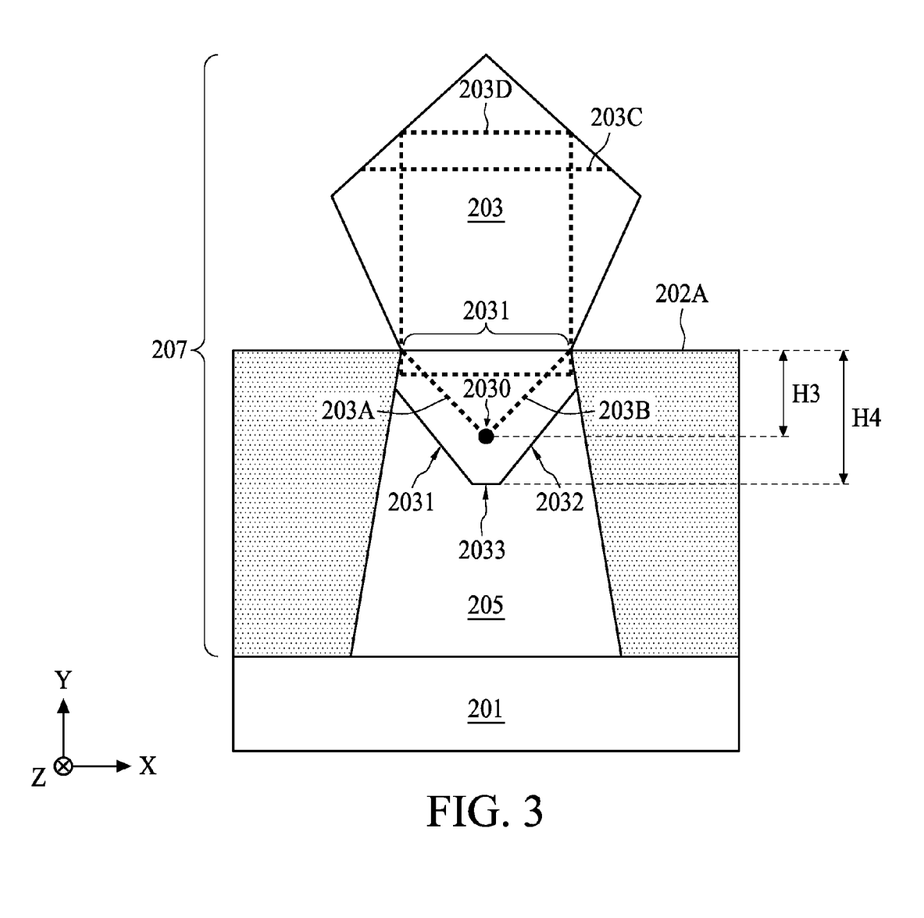
FIG. 3 is a cross sectional view of a regrowth source/drain region of a FinFET, in accordance with some embodiments of the present disclosure.

FIG. 3 is an enlarged view of a cross section of a semiconductor fin 207 framed by a dotted box 200 shown in FIG. 2. Identical numeral labels shown in FIG. 3 and FIG. 2 are referred to the same structural elements and is not repeated here for simplicity. In FIG. 3, a neck portion 2031 can be identified in the second region 203 of the semiconductor fin 207, that is, the neck portion 2031 can be situated at the same height level of the surface 202A of the insulating layer 202. Below the neck portion 2031, a recess is filled with the regrowth material; above the neck portion 2031, an elevated epitaxial structure is formed as a result of the epitaxial regrowth.

In FIG. 3, dislocations 203A, 203B are parallel to the Z direction and directed towards the surface 202A. In the semiconductor fin 207 shown in FIG. 3, the Z direction refers to a longitudinal direction of the semiconductor fin 207, whereas the X direction refers to a transverse direction of the semiconductor fin 207. For example, dislocations 203A, 203B intersect the surface 202A of the insulating layer 202 at about a 55-degree angle. In some embodiments, dislocation 203C is parallel to the surface 202A of the insulating layer 202 and parallel to both the transverse direction and the longitudinal direction of the semiconductor fin (i.e. the XZ plane). Dislocation 203D lies parallel to the transverse direction but angles towards the surface 202A of the insulating layer 202. These exemplary dislocations are not intended to be limiting, and the second region 203 may possess dislocations along any one or more of these planes.

Referring to FIG. 3, a height H3 of the V-shaped dislocation (203A, 203B) measured from the surface 202A of the insulating layer 202 to the pinch off point 2030 is less than a depth H4 of the second region 203 defined as from the surface 202A of the insulating layer 202 to the bottom surface 2033 of the second region 203. In some embodiments, the height H1 may be equal to the depth H2, but the height H1 shall not be greater than the depth H2, that is, neither the pinch off point 2030 nor the V-shaped dislocations 203A, 203B is extending to the first region 205 of the semiconductor fin 207.

In some embodiments, the second region 203 of the semiconductor fin 207 includes silicon germanium, phosphor-doped silicon, boron-doped silicon, phosphor-doped silicon carbide, boron-doped silicon carbide, or the combination thereof. In some embodiments, the phosphor-doped silicon forms a special pseudocubic phase $Si_3P_4$ which possesses a smaller lattice constant (about 5.0 Å) than that of the silicon, and thus exerting a tensile stress to the channel region (wrapped by the metal gate 210 and thus not shown in FIG. 2) of the FinFET 20.

Figure 4:
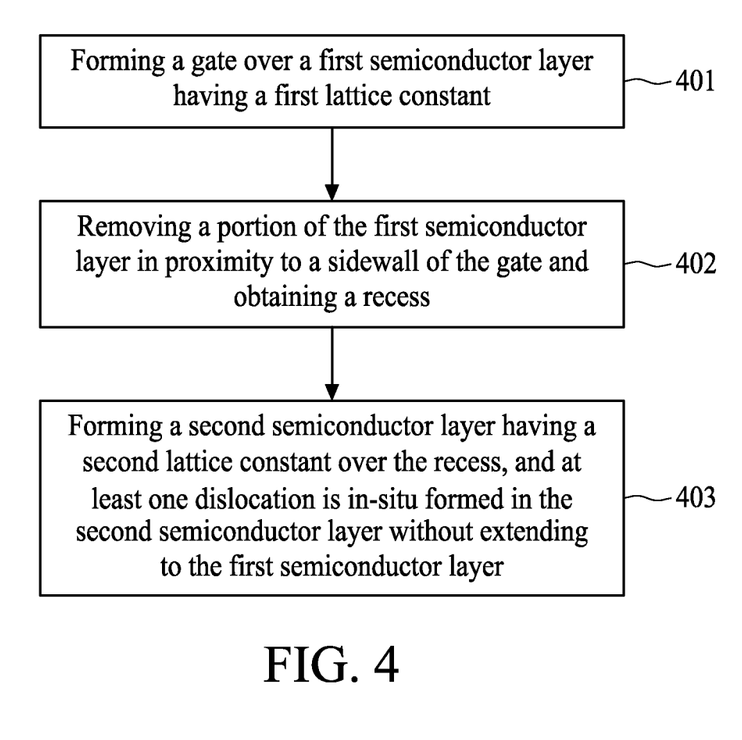
FIG. 4 is an operational flow of a method for manufacturing a semiconductor structure, in accordance with some embodiments of the present disclosure.

FIG. 4 is an operational flow of a method for manufacturing a semiconductor structure. In operation 401, a gate is formed over a first semiconductor layer having a first lattice constant. In operation 402, a portion of the first semiconductor layer that is close to a sidewall of the gate is removed and as a result, a recess is formed on the first semiconductor layer. In operation 403, a second semiconductor layer having a second lattice constant is formed in the recess. In some embodiments, the operation 403 is an epitaxial lattice growth that induces an in situ formation of at least one dislocation in the second semiconductor layer. The dislocation formed inside the second semiconductor layer is not extending to the first semiconductor layer.

Figure 5:
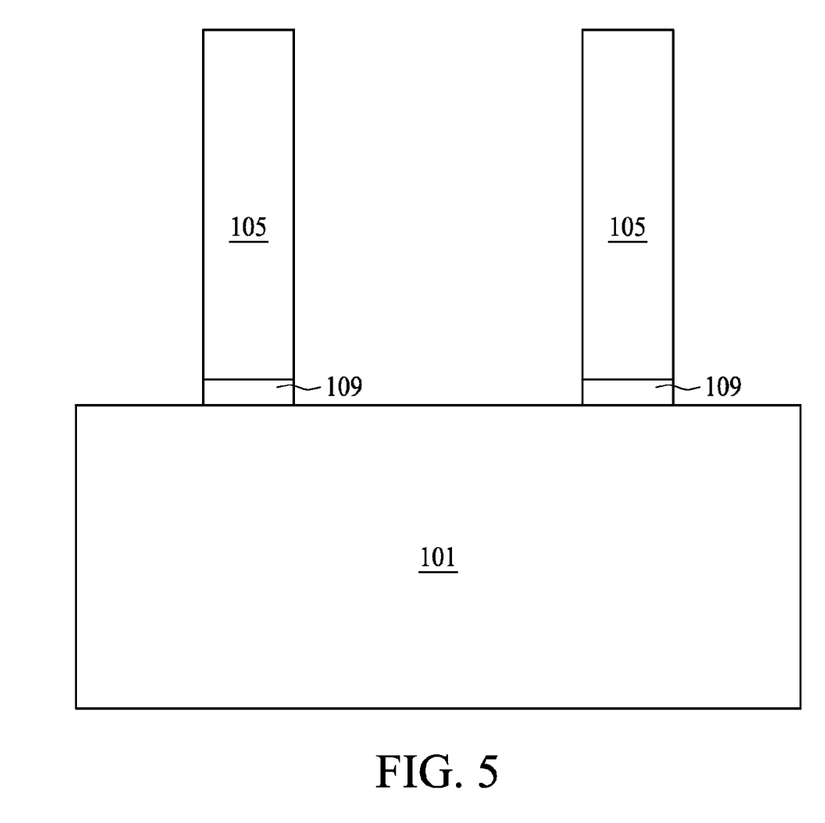
FIG. 5 to FIG. 9 are cross sectional views of an operation in a method for manufacturing a regrowth source/drain region between two gates of a planar transistor, in accordance with some embodiments of the present disclosure.
Figure 6:
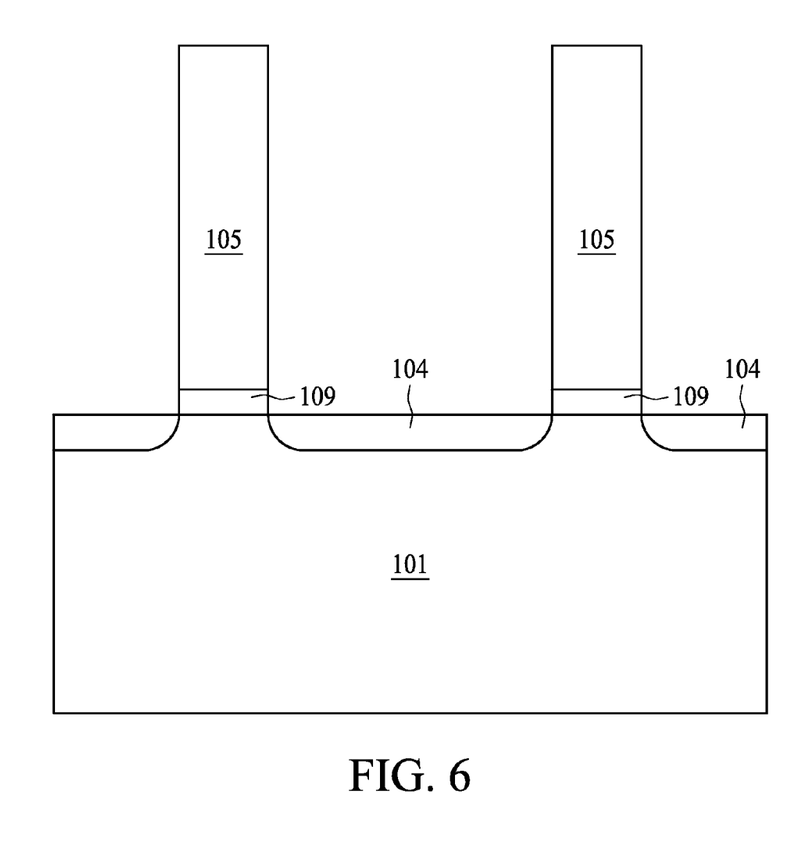
Figure 7:
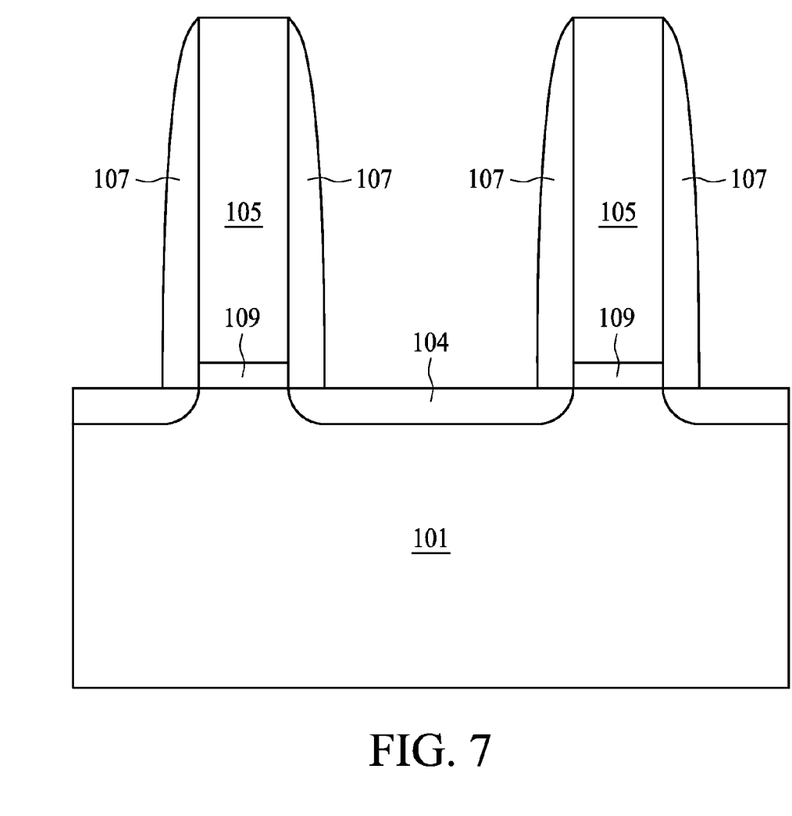

FIG. 5 to FIG. 9 are cross sectional views of an operation in a method for manufacturing a regrowth source/drain region between two gates of a planar transistor. FIG. 5 to FIG. 7 show operation 401 forming a gate structure over a first semiconductor layer or a substrate 101. In some embodiments, the gate structure is a polysilicon gate over a planar transistor. In other embodiments, the gate structure is a metal gate over a FinFET. Identical numeral labels shown in the following figures and the figures previously discussed in the present disclosure referred to the same structural elements and are not repeated here for simplicity. In FIG. 5, a gate electrode 105 and a gate dielectric 109 is formed by lithography operations on a substrate 101. The gate electrode 105 can be formed by a procedure including deposition, photolithography patterning, and etching processes. The deposition processes include chemical vapor deposition (CVD), physical vapor deposition (PVD), atomic layer deposition (ALD), high density plasma CVD (HDPCVD), metal organic CVD (MOCVD), remote plasma CVD (RP-CVD), plasma enhanced CVD (PECVD), plating, other suitable methods, and/or combinations thereof.

In FIG. 6, lightly doped drain/source (LDD) regions 104 are formed, for example, by implanting a n-type impurity. Gate electrodes 105 act as masks so that an inner edges of LDD regions 104 are substantially aligned with the edges of gate electrodes 105, respectively. In FIG. 7, gate spacers 107 may be formed using commonly used techniques, such as plasma enhanced chemical vapor deposition (PECVD), low-pressure chemical vapor deposition (LPCVD), sub-atmospheric chemical vapor deposition (SACVD), or the like. The formation of gate spacers 107 may include blanket forming gate spacer layers, and then performing etching steps to remove the horizontal portions of the gate spacer layers which lie upon a top surface of the gate electrode 105, so that the remaining vertical portions of the gate spacer layers form gate spacers 107.

Figure 8:
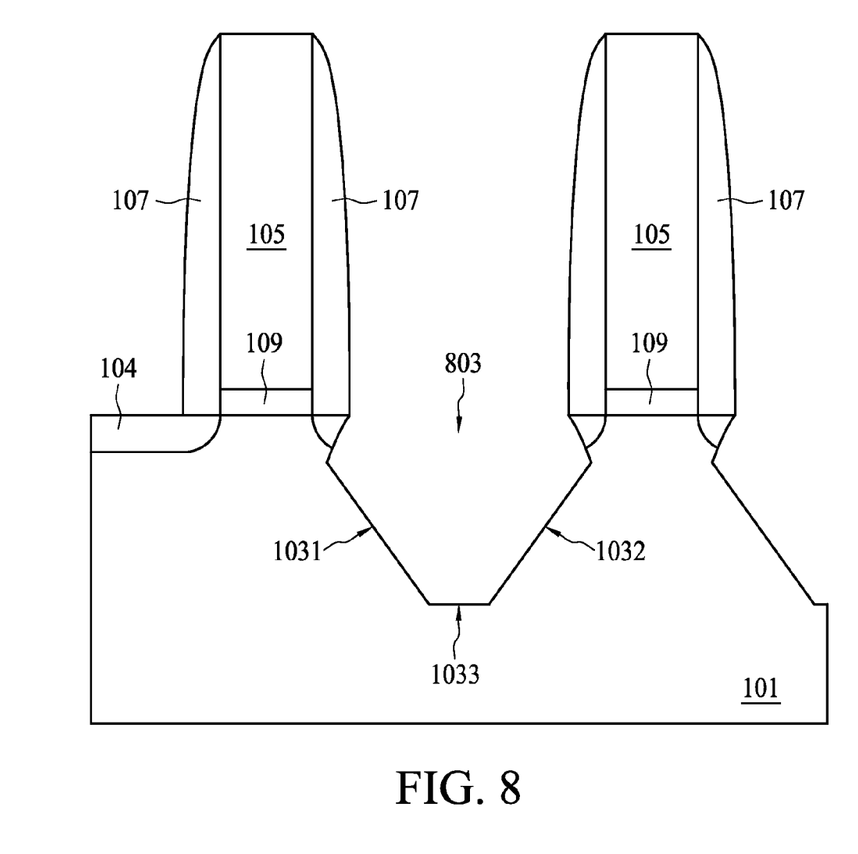

FIG. 8 shows operation 402 removing a portion of the first semiconductor layer or a substrate 101 in proximity to a sidewall of the gate and obtaining a recess 803. Any suitable amount of material may be removed from the first semiconductor layer or a substrate 101. However, the amount removed can be tailored by controlling etching conditions, that is, the depth of the recess 803 is controllable by applying different etchant at various etching conditions. The removing operation 402 may include forming a photoresist layer or a capping layer (such as an oxide capping layer) over the planar transistor shown in FIG. 7, patterning the photoresist or capping layer to have openings that expose the S/D regions of the planar transistor, and etching back material from the first semiconductor layer or the substrate 101. In the depicted embodiment, the planar transistor is etched by a dry etching process. Alternatively, the etching process is a wet etching process, or combination dry and wet etching process. Removal may include a lithography process to facilitate the etching process. The lithography process may include photoresist coating (e.g., spin-on coating), soft baking, mask aligning, exposure, post-exposure baking, developing the photoresist, rinsing, drying (e.g., hard baking), other suitable processes, or combinations thereof. Alternatively, the lithography process is implemented or replaced by other methods, such as maskless photolithography, electron-beam writing, and ion-beam writing. In yet another alternative, the lithography process could implement nanoimprint technology. In some embodiments, the lattice planes preserved after the removing operation can be the {111} planes 1031, 1032 and the {001} plane 1033 as shown in FIG. 8.

Figure 9:
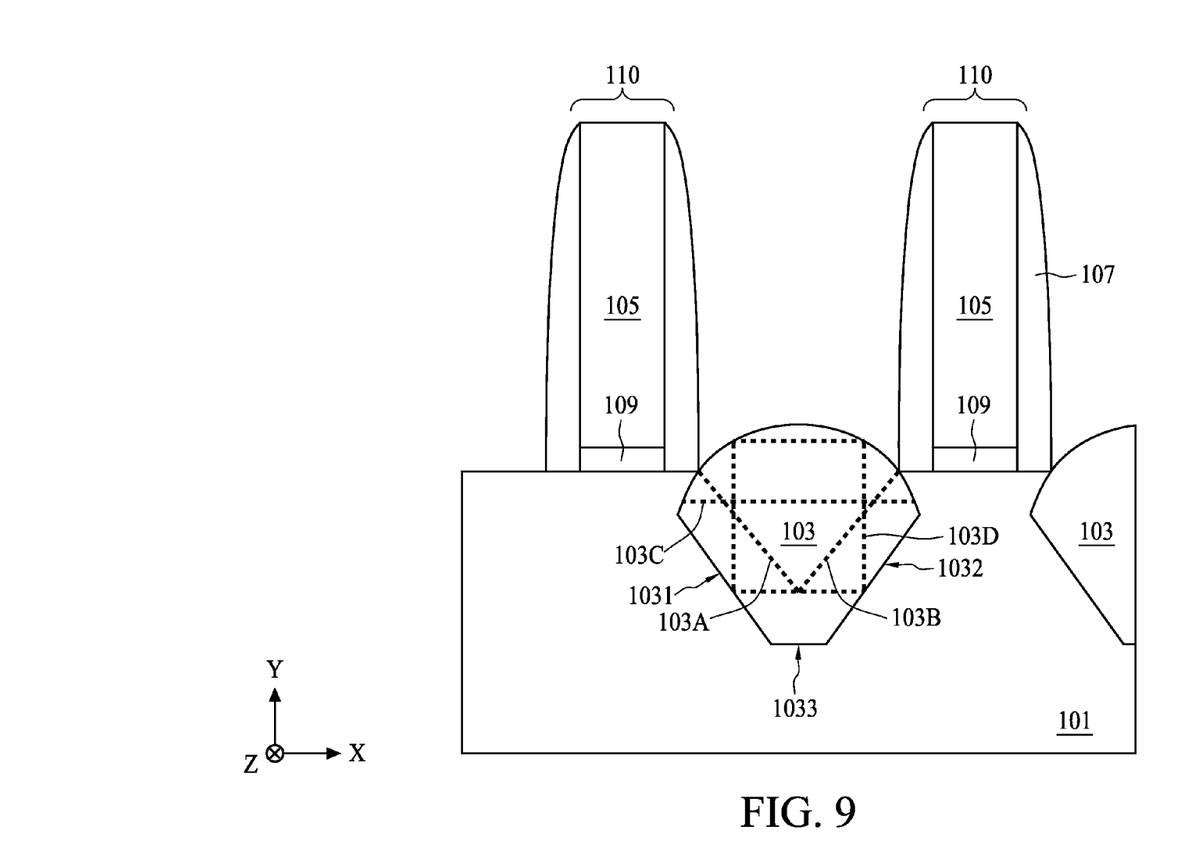

FIG. 9 shows operation 403 forming a second semiconductor layer or a regrowth region 103 in the recess. The second semiconductor layer or a regrowth region 103 are formed over the S/D regions of the planar transistor. The second semiconductor layer may be formed by one or more epitaxy or epitaxial (epi) processes, such as phosphor-doped or boron-doped silicon regrowth layer, SiGe regrowth layer, SiC regrowth layer, phosphor-doped or boron-doped SiC regrowth layer, pseudocubic $Si_3P_4$ regrowth layer, and/or other suitable regrowth layer that can be formed in a crystalline state on the planar transistor. The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the first semiconductor layer or the substrate 101 of the planar transistor.

In FIG. 9, the secondary semiconductor layer may be doped by an in situ manner (i.e., providing dopant precursor and matrix material precursor at the same time) or by an ion-implantation operation. In some embodiments, the doping species including p-type dopants, such as boron or BF2; n-type dopants, such as phosphorus or arsenic; and/or other suitable dopants are applied in situ to the regrowth operation. In other embodiments, the secondary semiconductor layer is epitaxially grown and then subjecting to an implantation operation. One or more annealing processes may be performed to activate the secondary semiconductor layer. The annealing processes comprise rapid thermal annealing (RTA) and/or laser annealing processes.

In some embodiments, a Si:P (phosphorous-doped silicon) second semiconductor layer is formed in the recess by a CVD deposition operation using $PH_3$ as phosphor precursor and at least one of $SiH_2Cl_2$, $SiH_4$, $Si_2H_6$ as silicon precursors. The $PH_3$ flow rate is from about 100 to about 400 SCCM, and the total flow rate for the silicon precursors is from about 100 to about 500 SCCM. The carrier gas $H_2$ has a flow rate of from about 3 to about 20 SLM. The growth temperature is kept in a range of from about 600 to about 700 degrees Celsius, and the chamber pressure is controlled within a range of from about 100 to about 600 Torr. A Si:P second semiconductor layer 103 can be formed by the above growth condition with at least one dislocation in-situ formed therein and without extending to the first semiconductor layer or the substrate 101. In some embodiments, the dislocation is a V-shaped dislocation 103A, 103B as previously discussed in FIG. 1. In some embodiments, a flow rate ratio of the silicon precursors and the dopant gas precursor, for example, phosphor precursors, is in a range of from about 0.2 to about 5. In some embodiments, the flow rate ratio of the silicon precursors and the phosphor precursors is close to 1.

In some embodiments, the Si:P second semiconductor layer is a pseudocubic $Si_3P_4$ phase which possesses a smaller lattice constant than that of the first semiconductor layer or the substrate 101, and the transistor structure shown in FIG. 9 is a planar nMOS structure. The pseudocubic $Si_3P_4$ phase exerts a tensile stress on a channel region underneath the gate 110, and thus enhancing the electron mobility in the nMOS structure.

In some embodiments, a SiC:P (phosphorous-doped silicon carbide) second semiconductor layer is formed in the recess by a CVD deposition operation using $PH_3$ as phosphor precursor, at least one of $SiH_2Cl_2$, $SiH_4$, $Si_2H_6$ as silicon precursors, and monomethalsilane (MMS) as carbon precursors. In some embodiments, the carbon source may include silylalkanes such as monosilylmethane, disilylmethane, trisylmethane and tetrasilylmethane, and/or dimethyl silane. In some embodiments, a carbon source comprises $H_3Si-CH_2-SiH_2-CH_3$ (1,3-disilabutane). The $PH_3$ flow rate is from about 100 to about 400 SCCM, the total flow rate for the silicon precursors is from about 100 to about 500 SCCM, and the MMS flow rate is from about 100 to about 300 SCCM. The carrier gas $H_2$ has a flow rate of from about 3 to about 20 SLM. The growth temperature is kept in a range of from about 600 to about 700 degrees Celsius, and the chamber pressure is controlled within a range of from about 100 to about 600 Torr. A SiC:P second semiconductor layer 103 can be formed by the above growth condition with at least one dislocation in-situ formed therein and without extending to the first semiconductor layer or the substrate 101. In some embodiments, at least one dislocation (103A, 103B, 103C, 103D) is in situ formed as previously discussed in FIG. 1. In some embodiments, a flow rate ratio of the silicon precursors and the dopant gas precursor, for example, phosphor precursors, is in a range of from about 0.2 to a bout 5. In some embodiments, the flow rate ratio of the silicon precursors and the phosphor precursors is close to 1.

Figure 10:
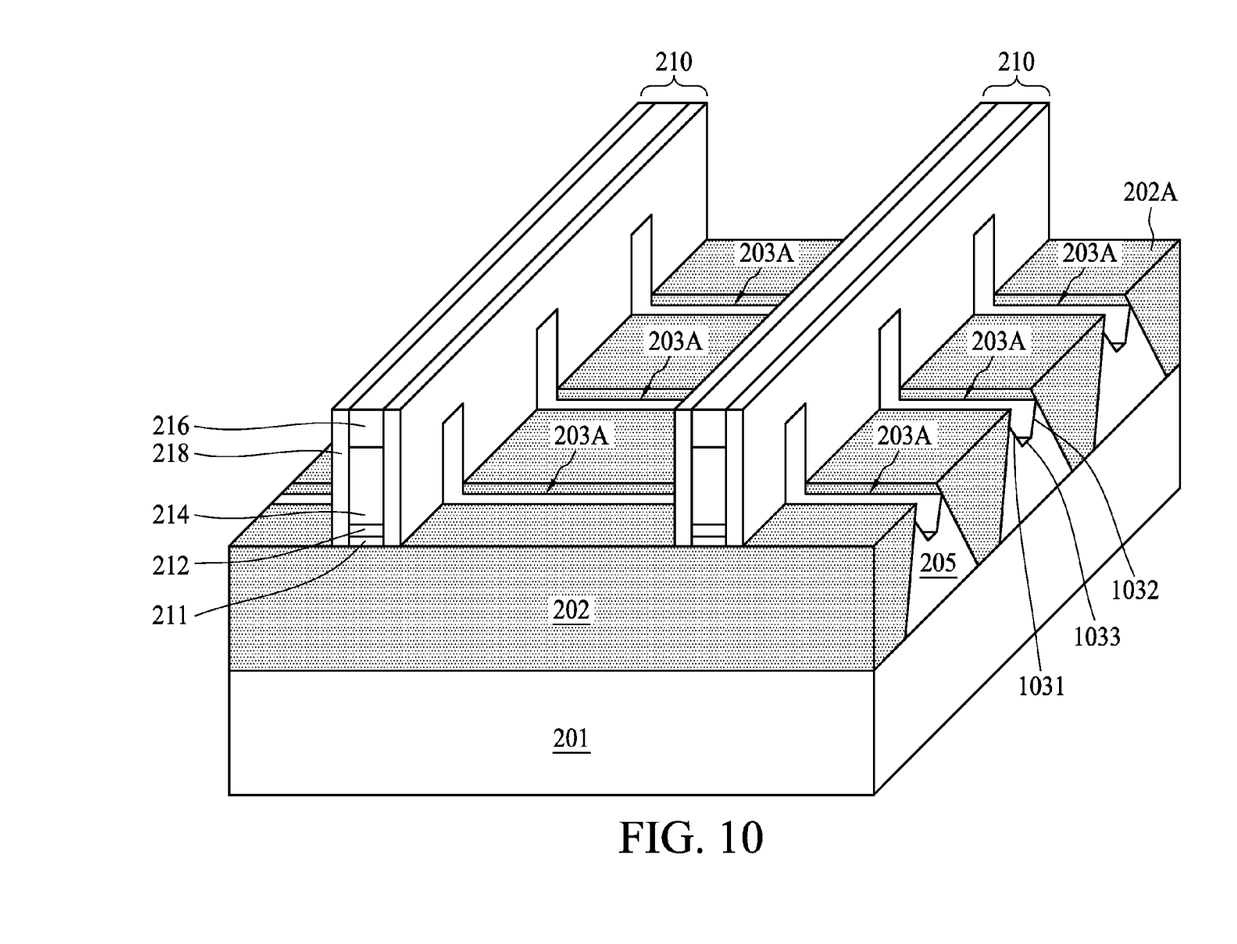
FIG. 10 to FIG. 11 are perspective views of an operation in a method for manufacturing a regrowth source/drain region in a FinFET, in accordance with some embodiments of the present disclosure.

Referring to FIG. 10, the removing operation 402 is illustrated on a FinFET. Identical numeral labels shown in FIG. 10, FIG. 3, and FIG. 2 are referred to the same structural elements and is not repeated here for simplicity. In FIG. 10, recesses 203A are formed by etching the original semiconductor fin or the first semiconductor layer 205 isotropically or anisotropically by photolithography operations. In some embodiments, the bottom of the recesses 203A shows preferred bottom surface 1033 and an inclined surface 1031, 1032 corresponding to a {001} plane and a {111} plane, respectively. The portion of the semiconductor fin wrapped by the gate 210 is not removed in the removing operation 402 discussed herein due to the presence of the hard mask layer 216 and additional photoresist layer (not shown) patterned on the gate 210, protecting the gate 210 and thus the wrapped semiconductor fin or the first semiconductor layer 205 from the attack of the etchants.

Figure 11:
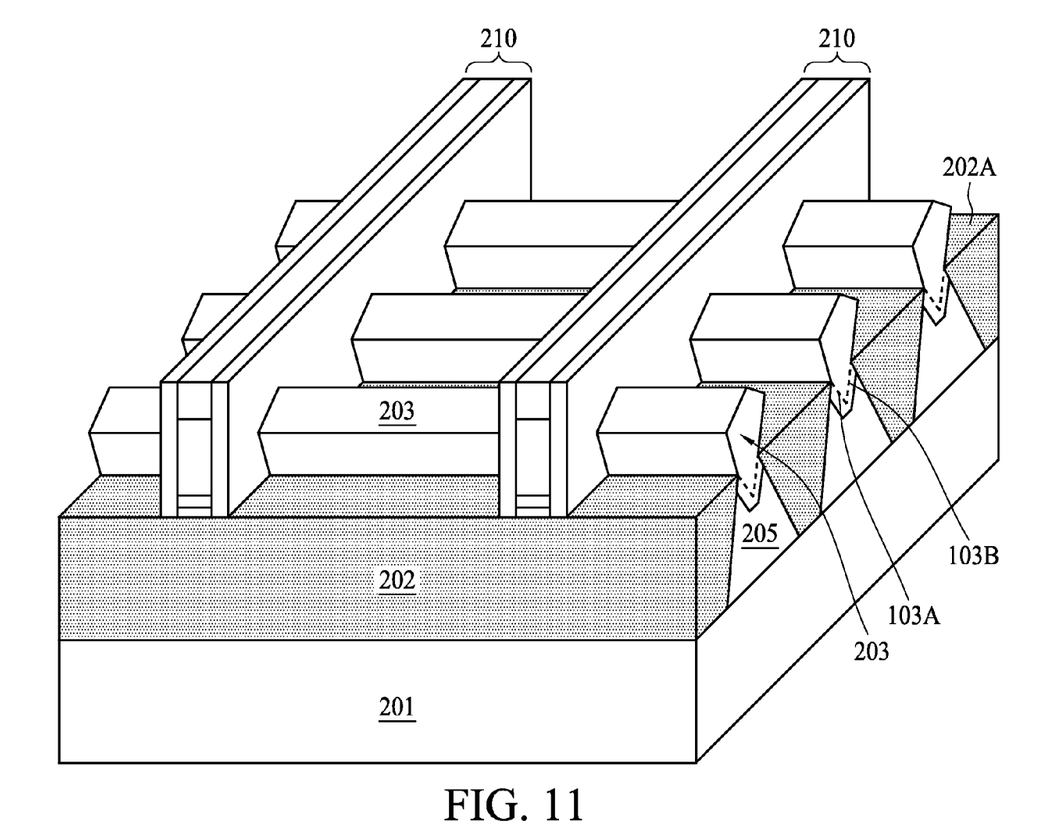

In subsequent operations, as shown in FIG. 11, the second semiconductor layer 203 is epitaxially grown in recesses 203A by a selective epitaxial growth (SEG) or a cyclic deposition etch (CDE). In some embodiments, an SEG is performed by introducing growth gases such as $SiH_2Cl_2$, $SiH_4$, $Si_2H_6$ and MMS, doping gases $PH_3$ or $B_2H_6$, and etching gas selected from HCl, HF, $Cl_2$, and combinations thereof, to form a phosphor-doped or boron-doped silicon carbide second semiconductor layer 203. Alternatively, the etching gas includes a gas selected from the group consisting essentially of $C_xF_yH_z$, $C_xCl_yH_z$, $Si_xF_yH_z$, $Si_xCl_yH_z$, with values x, y, and z represent the percentage of the respective elements. During the SEG, both growth and etch co-exist. In different epitaxy stages of the embodiments, the growth rate may be greater than or smaller than the etch rate, and hence the corresponding net effects may be growth or etching. In some embodiments, the SEG is performed using chemical vapor deposition in a chamber, in which the total pressure of gases may be between about 100 Torr and about 600 Torrs, and the temperature may be between about 400 and about 800 degrees Celsius.

In some embodiments, a CDE is performed by introducing a continuous flow of one or more vapor-phase etchants into the processing chamber. The term "continuous" as used herein refers to a continued flow of one or more etchants during the entire selective deposition process (for example, $Cl_2$) while other reactants are started and stopped cyclically several times (for example, HCl). Such a continuous flow may include one or more etchants that flow throughout the selective deposition process. In some embodiments, one or more etchants may be introduced intermittently throughout the process, while at least one other etchant is flowing at all times throughout the selective deposition process. In some embodiments, the silicon-containing source includes one or more of the following sources, silane ($SiH_4$), dichlorosilane or DCS ($SiCl_2H_2$), disilane ($Si_2H_6$), monochlorodisilane (MCDS), dichlorodisilane (DCDS), trisilane ($Si_3H_8$), or 2,2-dichlorotrisilane. The dopant source includes phosphine ($PH_3$) or arsine ($AsH_3$). As such, the second semiconductor layer 203 incorporating a dopant will be deposited partially in the recess and partially elevated to the surface 202A of the insulating layer 202. In some embodiments, the second semiconductor layer 203 includes phosphorous-doped or arsenic-doped silicon or silicon carbide for an nMOS structure.

In the forming operation 403 described in the present disclosure, at least one dislocation is formed in the second semiconductor layer 203 without extending to the first semiconductor layer 205. In other words, several steps (i.e. capping layer formation, pre-amorphization implantation, thermal anneal, capping layer removal) in a general SMT operation can be omitted but a strained second semiconductor layer 203 with at least one dislocation can still be obtained without any pre-formed dislocation in the first semiconductor layer 205 as shown in the general SMT operation.

Some embodiments of the present disclosure provide a semiconductor structure including a substrate made of semiconductor material with a first lattice constant, a regrowth region made of semiconductor material with a second lattice constant and partially positioned in the substrate, and at least one dislocation in the regrowth region without extending to the substrate.

In some embodiments of the present disclosure, the at least one dislocation crosses each other and form a V-shaped dislocation in the regrowth region of the semiconductor structure in the present disclosure.

In some embodiments of the present disclosure, the V-shaped dislocation includes a height measured from a top surface of the substrate to an intersection of the V-shape dislocation, and the regrowth region includes a depth measured from the top surface of the substrate to a bottom of the regrowth region, and the height of the V-shaped dislocation is equal to or smaller than the depth of the regrowth region.

In some embodiments of the present disclosure, the at least one dislocation is parallel to the top surface of the substrate.

In some embodiments of the present disclosure, the regrowth region is a source region or a drain region of the semiconductor structure.

In some embodiments of the present disclosure, the regrowth region includes phosphor-doped silicon, phosphor-doped silicon carbide, or the combination thereof.

In some embodiments, the first lattice constant of the semiconductor structure is greater than the second lattice constant of the semiconductor structure by at least 1%.

Some embodiments of the present disclosure provide a semiconductor structure. The semiconductor structure includes an insulating layer having a top surface, positioning on a substrate, a semiconductor fin partially located in the insulating layer, positioning on the substrate, and a metal gate over the semiconductor fin and the insulating layer. The semiconductor fin includes a first region including a first lattice constant, and a second region in proximity to the metal gate, including a second lattice constant. At least one dislocation is located only in the second region of the semiconductor fin.

In some embodiments of the present disclosure, the second region of the semiconductor fin includes a neck portion.

In some embodiments of the present disclosure, the at least one dislocation includes a height measured from the top surface of the insulating layer to a bottom end of the dislocation, and the second region of the semiconductor fin includes a depth measured from the top surface of the insulating layer to a bottom of the second region. The height of the dislocation is equal to or smaller than the depth of the second region.

In some embodiments of the present disclosure, the at least one dislocation is parallel to a longitudinal axis of the semiconductor fin.

In some embodiments of the present disclosure, the at least one dislocation is parallel to a transverse axis of the semiconductor fin.

In some embodiments of the present disclosure, the second region of the semiconductor fin includes a pseudocubic $Si_3P_4$ phase.

Some embodiments of the present disclosure provide a method for manufacturing a semiconductor structure. The method includes forming a gate over a first semiconductor layer having a first lattice constant, removing a portion of the first semiconductor layer in proximity to a sidewall of the gate and obtaining a recess, and forming a second semiconductor layer having a second lattice constant in the recess. An at least one dislocation is in-situ formed in the second semiconductor layer without extending to the first semiconductor layer.

In some embodiments of the present disclosure, the removing the portion of the first semiconductor layer includes etching the first semiconductor layer by a wet etching, a dry etching, or the combination thereof to form the recess having a predetermined depth.

In some embodiments of the present disclosure, the forming the second semiconductor layer includes performing a cyclic deposition etch, a selective epitaxy growth, or a combination thereof.

In some embodiments of the present disclosure, the forming the second semiconductor layer includes an in-situ doping operation or an ion-implantation operation.

In some embodiments of the present disclosure, the forming the second semiconductor layer includes forming phosphor-doped silicon carbide, pseudocubic $Si_3P_4$, or the combination thereof.

In some embodiments of the present disclosure, a ratio of a flow rate of a silicon precursor and a flow rate of a phosphor precursor is in a range of from about 0.2 to about 5.

In some embodiments of the present disclosure, the forming the gate over the first semiconductor layer includes forming a metal gate over a semiconductor fin or forming a polysilicon gate over a planar semiconductor layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:
    forming a gate over a first semiconductor layer having a first lattice constant;
    removing a portion of the first semiconductor layer in proximity to a sidewall of the gate and obtaining a recess; and
    forming a second semiconductor layer having a second lattice constant over the recess,
    wherein at least one dislocation is in-situ formed in the second semiconductor layer without extending to the first semiconductor layer while applying an in-situ doping operation at the forming of the second semiconductor layer by vapor phase epitaxy, the at least one dislocation comprising a pinch off point spaced apart from an entire boundary between the first semiconductor layer and the second semiconductor layer.

2. The method for manufacturing a semiconductor structure of claim 1, wherein the removing the portion of the first semiconductor layer comprises etching the first semiconductor layer by a wet etching, a dry etching, or the combination thereof to form the recess having a predetermined depth.

3. The method for manufacturing a semiconductor structure of claim 1, wherein the forming the second semiconductor layer comprises performing a cyclic deposition etch operation, a selective epitaxial growth, or the combination thereof.

4. The method for manufacturing a semiconductor structure of claim 1, wherein the forming the second semiconductor layer comprises forming phosphor-doped silicon carbide, pseudocubic $Si_3P_4$, or the combination thereof.

5. The method for manufacturing a semiconductor structure of claim 4, wherein a ratio of a flow rate of a silicon precursor and a flow rate of a phosphor precursor is in a range of from about 0.2 to about 5.

6. A method for manufacturing a semiconductor structure, comprising:
    forming a gate over a first semiconductor layer having a first lattice constant;
    removing a portion of the first semiconductor layer in proximity to a sidewall of the gate and obtaining a recess; and
    forming a second semiconductor layer having a second lattice constant over the recess,
    wherein at least one dislocation is located only in the second semiconductor layer while applying an in-situ doping operation at the forming of the second semiconductor layer by vapor phase epitaxy, the at least one dislocation comprising a pinch off point spaced apart from an entire boundary of the first semiconductor layer and the second semiconductor layer.

7. The method for manufacturing a semiconductor structure of claim 6, wherein the removing the portion of the first semiconductor layer comprises preserving a {001} plane at a bottom surface of the recess and a {111} plane at a slanted surface of the recess.

8. The method for manufacturing a semiconductor structure of claim 6, wherein the forming the second semiconductor layer comprises forming a phosphorous-doped silicon carbide (SiC:P).

9. The method for manufacturing a semiconductor structure of claim 8, wherein a ratio of a flow rate of a silicon precursor and a flow rate of a phosphor precursor is in a range of from about 0.2 to about 5.

10. The method for manufacturing a semiconductor structure of claim 8, wherein a growth temperature of forming the second semiconductor layer is in a range of from about 600 to about 700 degrees Celsius, and a chamber pressure of forming the second semiconductor layer is in a range of from about 100 to about 600 Torr.

11. The method for manufacturing a semiconductor structure of claim 8, wherein the forming the SiC:P comprises introducing monomethalsilane as carbon precursors with a flow rate of from about 100 to about 300 Standard-state Cubic Centimeters per Minute (SCCM).

12. A method for manufacturing a semiconductor structure, comprising:
- forming a gate over a semiconductor fin having a first lattice constant;
- removing a portion of the semiconductor fin in proximity to a sidewall of the gate and obtaining a recess; and
- forming a regrowth layer having a second lattice constant over the recess by vapor phase epitaxy with an in-situ doping operation,
- wherein an upright V-shaped dislocation is formed in the regrowth layer during the forming of the regrowth layer, the upright V-shaped dislocation being parallel to a longitudinal direction of the semiconductor fin.

13. The method for manufacturing a semiconductor structure of claim 12, wherein the forming the regrowth layer comprises forming a source region or a drain region of the semiconductor structure.

14. The method for manufacturing a semiconductor structure of claim 12, wherein the forming the regrowth layer comprises forming a pseudocubic $Si_3P_4$ phase.

15. The method for manufacturing a semiconductor structure of claim 14, wherein a ratio of a flow rate of a silicon precursor and a flow rate of a phosphor precursor is in a range of from about 0.2 to about 5.

16. The method for manufacturing a semiconductor structure of claim 14, wherein a growth temperature of the forming of the regrowth layer is in a range of from about 600 to about 700 degrees Celsius, and a chamber pressure of the forming of the regrowth layer is in a range of from about 100 to about 600 Torr.

17. The method for manufacturing a semiconductor structure of claim 12, wherein the forming the regrowth layer comprises forming a phosphorous-doped silicon carbide (SiC:P).

18. The method for manufacturing a semiconductor structure of claim 12, wherein the forming the gate over the semiconductor fin comprises forming a polysilicon gate over the semiconductor fin of a FinFET.

* * * * *